(12) United States Patent
Cordero et al.

(10) Patent No.: US 11,168,878 B2
(45) Date of Patent: Nov. 9, 2021

(54) LED LUMINAIRE

(71) Applicant: Component Hardware Group, Inc., Lakewood, NJ (US)

(72) Inventors: Justine Cordero, Asbury Park, NJ (US); Zohreh Erfan, Toms River, NJ (US); Brion Gompper, Lakewood, NJ (US)

(73) Assignee: COMPONENT HARDWARE GROUP, INC., Lakewood, NJ (US)

( * ) Notice: Subject to any disclaimer, the term of this patent is extended or adjusted under 35 U.S.C. 154(b) by 381 days.

(21) Appl. No.: 16/292,994

(22) Filed: Mar. 5, 2019

(65) Prior Publication Data
US 2020/0284420 A1    Sep. 10, 2020

(51) Int. Cl.
| | |
|---|---|
| *F21V 29/77* | (2015.01) |
| *F21S 2/00* | (2016.01) |
| *F21S 8/02* | (2006.01) |
| *H05K 1/18* | (2006.01) |
| *F21V 15/01* | (2006.01) |
| *H05K 7/20* | (2006.01) |
| *F21Y 103/10* | (2016.01) |
| *F21Y 115/10* | (2016.01) |
| *F24C 15/20* | (2006.01) |

(52) U.S. Cl.
CPC .............. *F21V 29/77* (2015.01); *F21S 2/005* (2013.01); *F21S 8/02* (2013.01); *F21V 15/01* (2013.01); *F24C 15/2064* (2013.01); *H05K 1/18* (2013.01); *H05K 7/20409* (2013.01); *F21Y 2103/10* (2016.08); *F21Y 2115/10* (2016.08)

(58) Field of Classification Search
CPC ....... F21S 2/005; F21Y 2115/10; F21V 15/01; F21V 29/77; F21V 29/773; F21V 33/0088; F21V 33/0092; F21V 33/0096; F21V 31/00; F21V 31/005; H05K 1/18; H05K 7/20409; F24C 15/2064
See application file for complete search history.

(56) References Cited

U.S. PATENT DOCUMENTS

| | | | | |
|---|---|---|---|---|
| 5,481,443 | A * | 1/1996 | Wagner | F21S 8/022 362/153.1 |
| 6,474,846 | B1 * | 11/2002 | Kelmelis | F21V 17/164 248/231.91 |
| 9,039,238 | B2 * | 5/2015 | Kim | F21K 9/00 362/294 |
| 2009/0097262 | A1 * | 4/2009 | Zhang | F21S 8/026 362/364 |
| 2009/0141506 | A1 * | 6/2009 | Lan | F21S 8/02 362/351 |
| 2010/0039829 | A1 * | 2/2010 | Tsai | F21S 8/026 362/373 |
| 2010/0061108 | A1 * | 3/2010 | Zhang | F21S 8/026 362/364 |

(Continued)

*Primary Examiner* — Erin Kryukova
(74) *Attorney, Agent, or Firm* — Francis C. Hand; Carella, Byrne, Cecchi, Olstein, Brody & Agnello

(57) ABSTRACT

The LED luminaire is constructed with an LED/driver printed circuit board mounted directly on a floor of the heat sink assembly. By mounting the LED/driver printed circuit board directly in and on the heat sink assembly, the heat imposed on the LED/driver printed circuit board during use in a canopy hood over a cooking surface is transferred directly to the heat sink assembly for dissipation.

10 Claims, 9 Drawing Sheets

(56) References Cited

U.S. PATENT DOCUMENTS

| | | | |
|---|---|---|---|
| 2010/0110699 A1* | 5/2010 | Chou | F21S 8/026 362/365 |
| 2010/0172143 A1* | 7/2010 | Cunius | F21S 8/04 362/373 |
| 2011/0317412 A1* | 12/2011 | Paik | F21V 13/04 362/235 |
| 2012/0081912 A1* | 4/2012 | Yamamoto | F21S 8/026 362/382 |
| 2012/0162994 A1* | 6/2012 | Wasniewski | F21S 8/026 362/294 |
| 2012/0182723 A1* | 7/2012 | Sharrah | F21V 29/004 362/157 |
| 2013/0010476 A1* | 1/2013 | Pickard | F21S 8/026 362/311.03 |
| 2013/0057141 A1* | 3/2013 | Van De Ven | F21S 8/02 313/498 |
| 2013/0094178 A1* | 4/2013 | Huang | F21S 8/026 362/84 |
| 2013/0170190 A1* | 7/2013 | Song | F21V 21/044 362/147 |
| 2014/0016311 A1* | 1/2014 | Tyson | F21S 8/022 362/232 |
| 2014/0063810 A1* | 3/2014 | Randolph | F21K 9/00 362/294 |
| 2014/0218900 A1* | 8/2014 | Adair | F21S 8/022 362/183 |
| 2014/0347848 A1* | 11/2014 | Pisavadia | F21S 8/06 362/190 |
| 2015/0009676 A1* | 1/2015 | Danesh | H04R 17/00 362/364 |
| 2015/0338084 A1* | 11/2015 | Ryder | F21V 31/005 362/606 |
| 2018/0231197 A1* | 8/2018 | Danesh | F21V 7/041 |
| 2018/0372284 A1* | 12/2018 | Danesh | F21S 8/043 |

* cited by examiner

LED LUMINAIRE

This invention relates to an LED luminaire. More particularly, this invention relates to an LED canopy hood luminaire.

As is known, various types of luminaires have been marketed for a range of uses. In particular, luminaires have been made with light emitting diodes (LEDs) as a source for providing visible light while consuming a significantly lower amount of electricity (electrical energy), compared to incandescent luminaires of the same light output or lumens. However, LEDs are very sensitive to heat and can fail prematurely if exposed to too much heat.

For example, for use as a canopy hood luminaire application above a cooking surface, LEDs and other electronic components are designed to be able to operate in a hot (up to 80° Celsius) and humid environment at a distance of 4 feet or more above the cooking surface. Exposing LEDs to too much heat will cause the LEDs to degrade quicker than expected bringing down their lifespan and degrading their performance causing premature chromaticity shift and possible flickering.

Accordingly, it is an object of this invention to dissipate heat from an LED light fixture used in a canopy hood luminaire application.

It is another object of this invention to provide an LED luminaire that can be used in a canopy hood of commercial kitchens.

Briefly, the invention provides an LED luminaire that employs a unique heat sink assembly for dissipating heat.

In particular, the invention provides an LED luminaire that comprises a heat sink assembly and an LED/driver printed circuit board mounted directly on the heat sink assembly for transferring heat imposed on the printed circuit board directly to the heat sink assembly.

The heat sink assembly has a circular mounting flange for mounting of the luminaire in a canopy hood disposed over a cooking surface as well as an internal cavity with a floor that extends across the cavity.

The LED/driver printed circuit board is removably mounted on the floor of the heat sink assembly coaxially in the internal cavity for emitting light therefrom.

By mounting the LED/driver printed circuit board directly in and on the floor of the heat sink assembly, the heat generated by the LED/driver printed circuit board during use is transferred directly to the heat sink assembly.

The heat sink assembly also has a chamber sized to function as a junction box to receive wiring for delivering electricity to the LED/driver printed circuit board and includes a pair of diametrically disposed ports extending into communication with the chamber for receiving conductors from a mains power supply.

In addition, the heat sink assembly includes an array of fins extending radially outwardly of the chamber to aid in the dissipation of heat to the surrounding environment.

The luminaire also includes a junction box cover assembly mounted coaxially on the heat sink assembly to seal the chamber and a lens cover assembly that is removably mounted on the flange of the heat sink assembly for passage of light emitted from the printed circuit board.

The junction box cover assembly includes a ground wire connection for grounding the entire luminaire and provides space for electrically connecting the LED/driver printed circuit board to electrical mains.

In one embodiment, the lens cover assembly includes a circular collar removably secured to the flange of the heat sink assembly and a lens secured in the collar. The construction of the lens cover assembly is such that the assembly may be removed as a unit from the luminaire for replacement of a broken lens or to gain ready access to the LED/driver printed circuit board.

In this embodiment, the collar of lens cover assembly includes a radially inwardly directed lip and said lens cover assembly includes a circular insert secured concentrically within the collar with an upstanding flange fitting inside the mounting flange of the heat sink assembly. In addition, a gasket is seated in sealing relation in the insert and receives the lens.

These and other objects and advantages of the invention will become more apparent from the following detailed description taken in conjunction with the accompanying drawings wherein.

Figure 1:
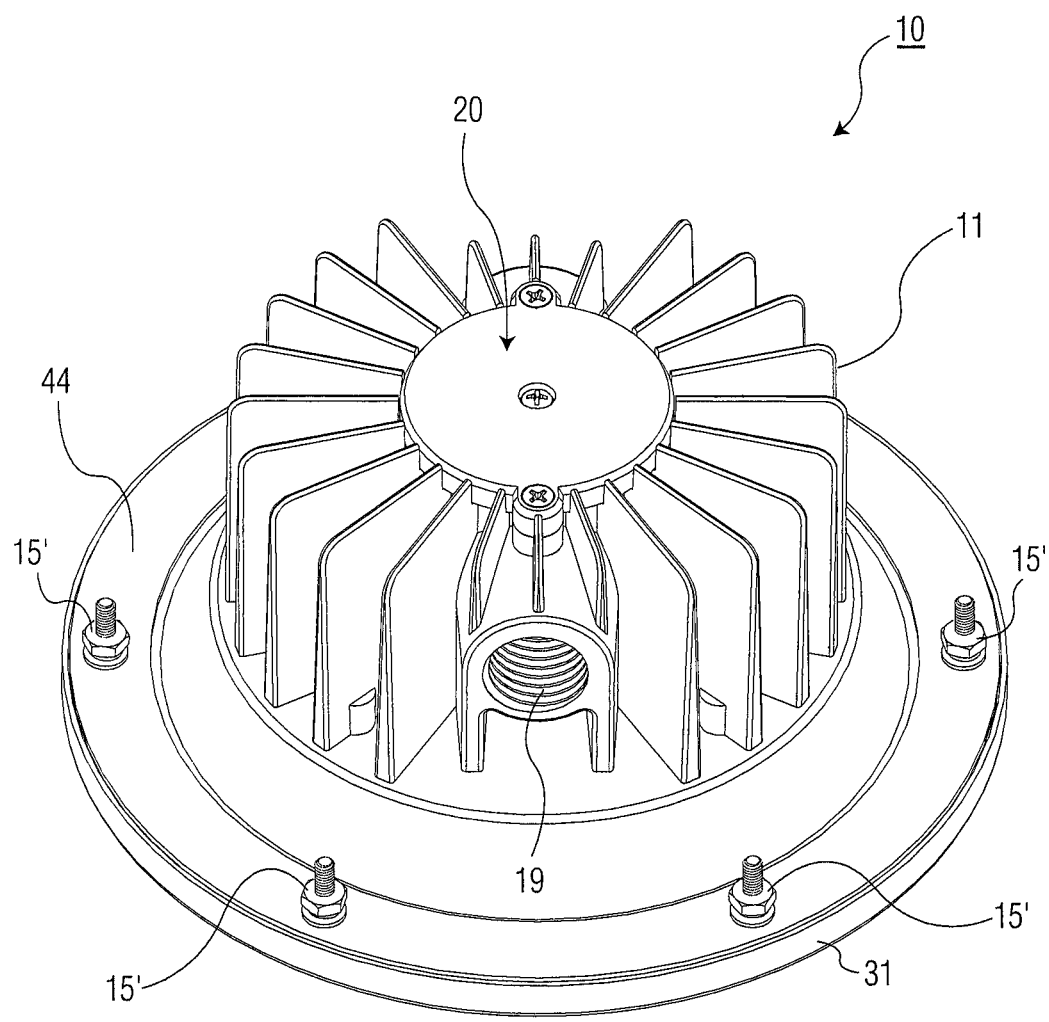
FIG. 1 illustrates a perspective rear view of an LED luminaire constructed in accordance with the invention.
Figure 5:
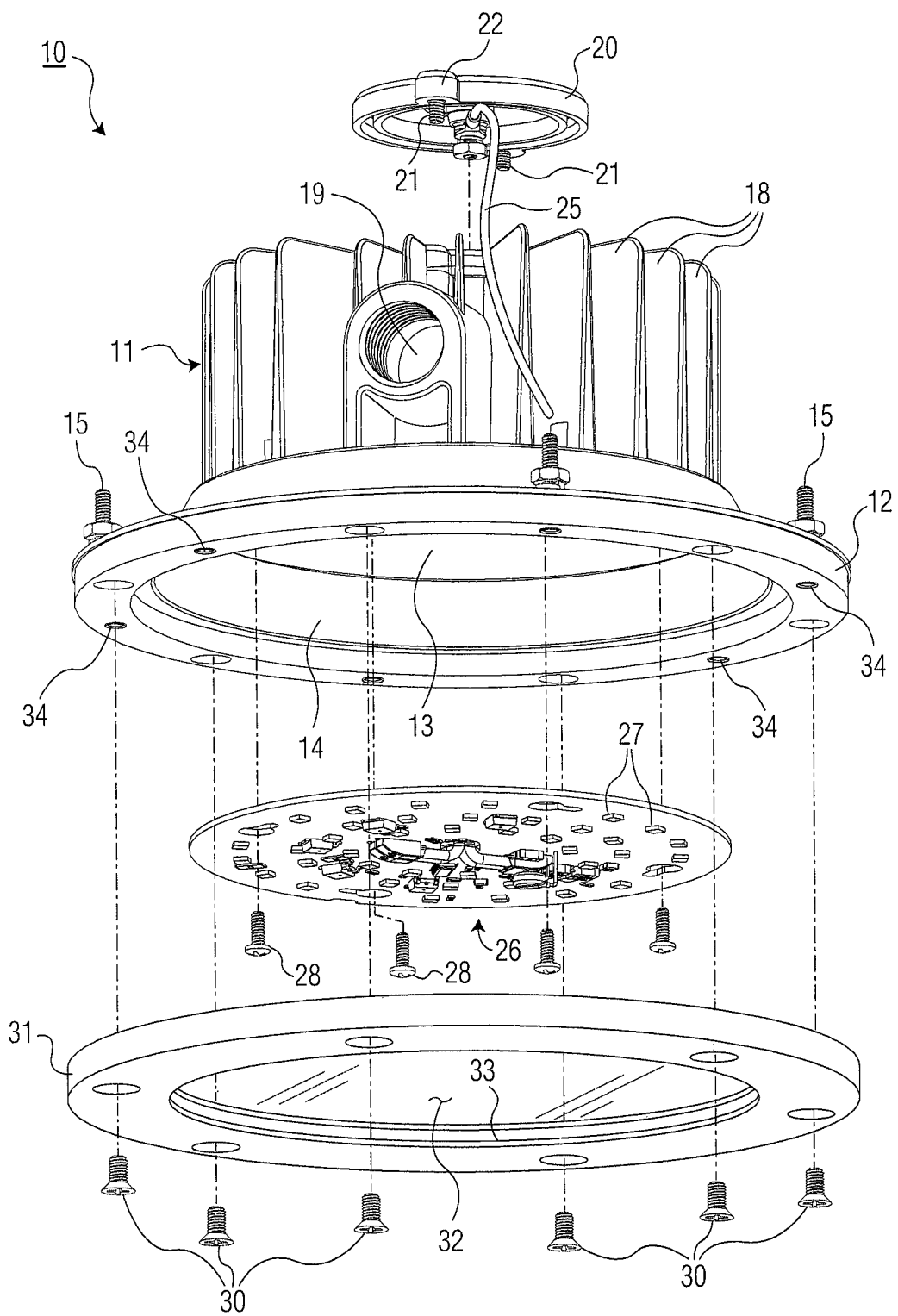
FIG. 5 illustrates an exploded view of the luminaire of FIG. 1.

Referring to FIGS. 1 and 5, the luminaire 10 includes a heat sink assembly 11 of one piece construction made of aluminum or other material for absorbing heat.

Figure 6:
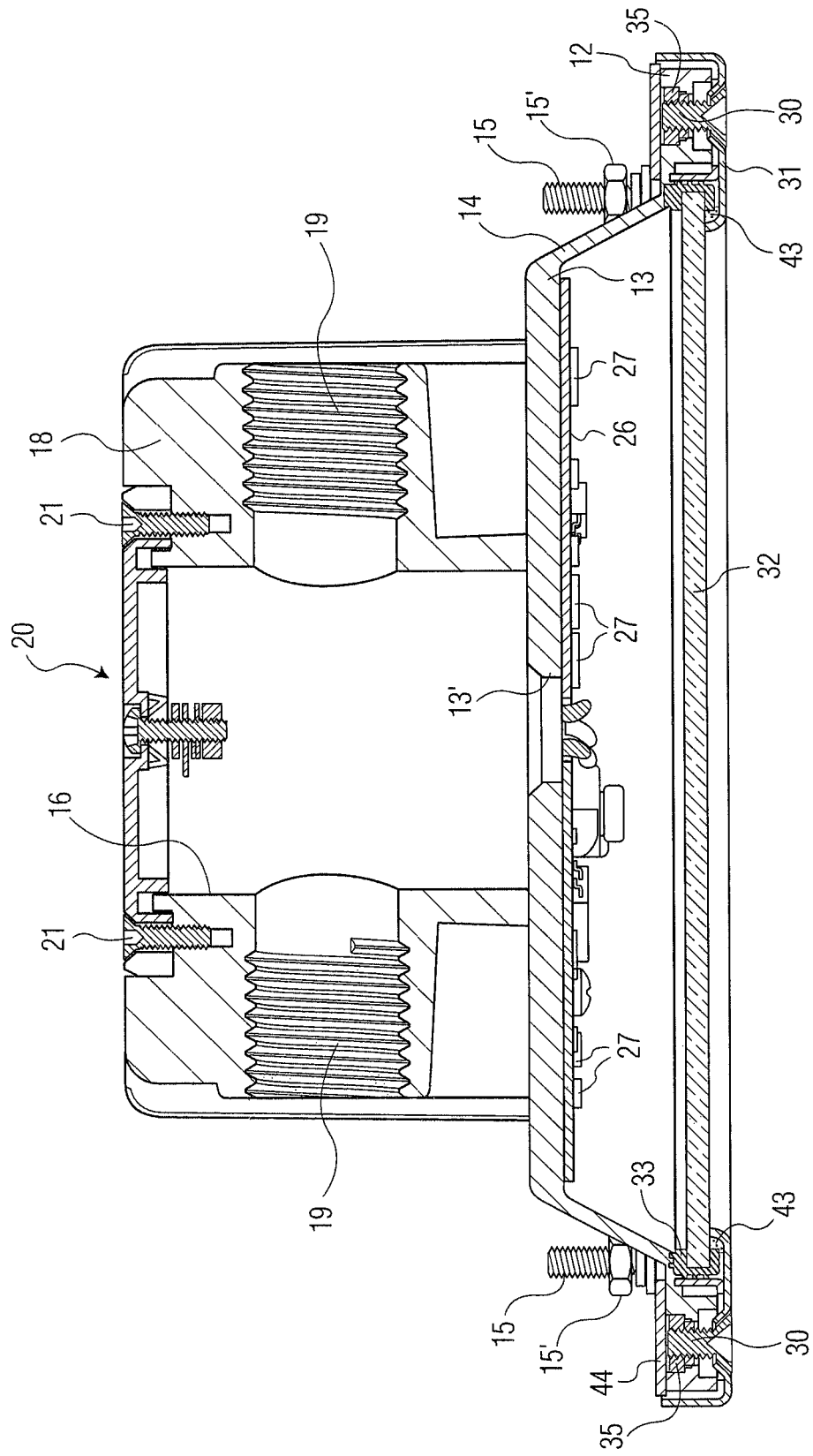
FIG. 6 illustrates a cross-sectional view of the luminaire of FIG. 1 taken on line 6-6 of FIG. 3.

As indicated in FIGS. 5 and 6, the heat sink assembly 11 has a circular mounting flange 12 and an internal cavity defined by a floor 13, and a tapered wall 14 that extends inwardly from the flange 12 to the floor 13. In addition, a plurality of threaded studs 15 are press-fitted into the mounting flange 12 in order to secure the luminaire to a canopy hood surface (not shown). In this respect, each stud 15 is provided with a nut and washer assembly 15' and the canopy hood is provided with through holes through which the studs 15 may be passed when the luminaire is being mounted in the canopy hood. Thereafter, the washer of each nut and washer assembly 15' is slid over a respective stud 15 and the nut of each nut and washer assembly 15' is threaded onto the respective stud 15 to clamp the luminaire 10 to the canopy hood surface.

Figure 3:
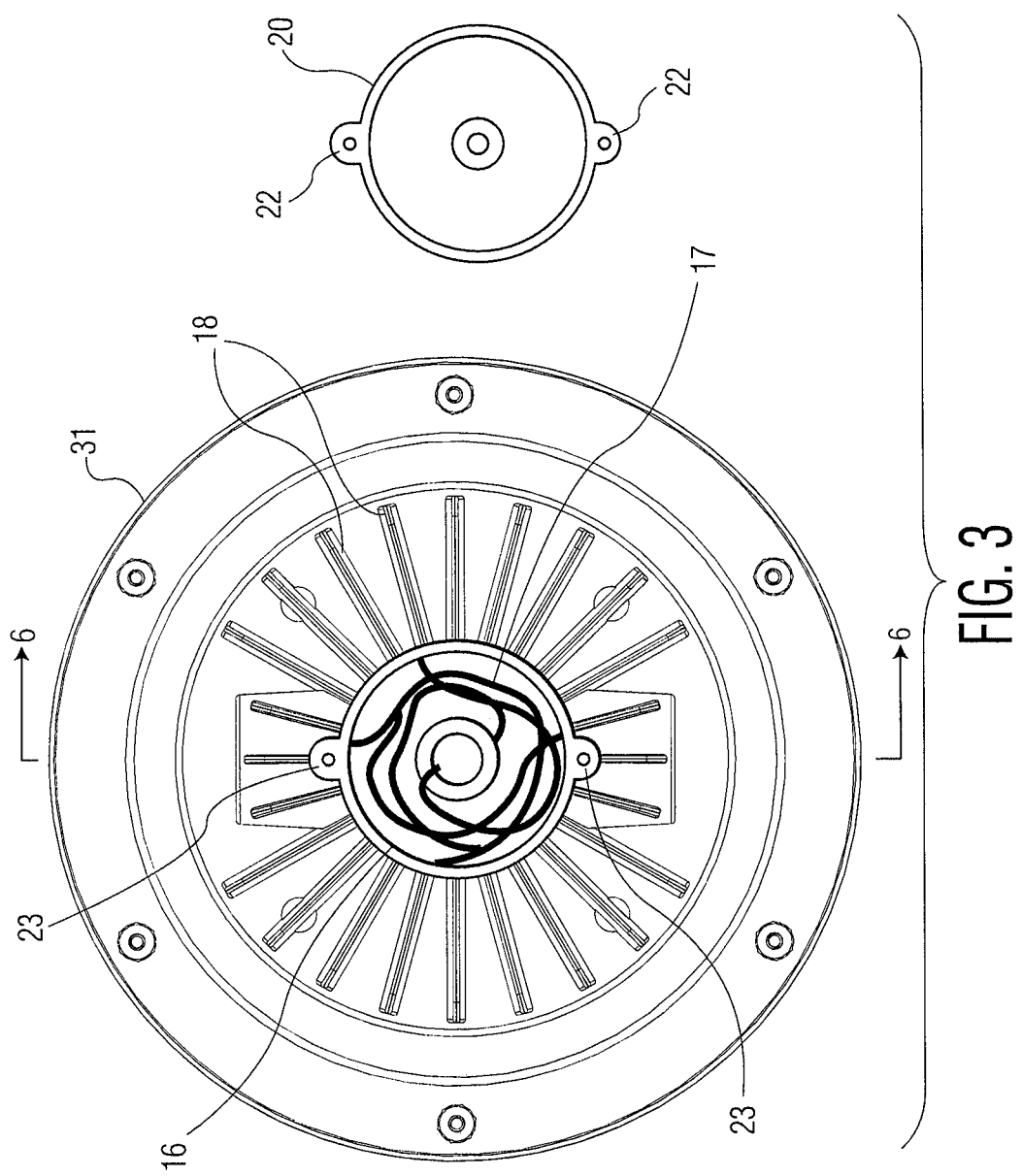
FIG. 3 illustrates a rear view of the luminaire of FIG. 1 with the junction box cover removed.

In addition, the heat sink assembly 11 includes a circular wall 16 (FIG. 6) that extends from the floor 13 to define a chamber sized to function as a junction box for receiving wires 17 (FIG. 3).

The heat sink assembly 11 has an array of fins 18 extending radially outwardly of the circular wall 16 to aid in the dissipation of heat to the surrounding environment as well as a pair of diametrically disposed ports 19 extending through the array of fins 18 into communication with the chamber for receiving conductors from a mains power supply (not shown).

The heat sink assembly 11 also includes a junction box cover assembly 20 mounted coaxially on the heat sink assembly to seal the chamber. As illustrated in FIG. 5, the junction box cover assembly 20 includes a pair of screws 21 that pass through a pair of diametrically disposed ears 22 for threading into a pair of lugs 23 (see FIG. 3) extending outwardly from the top of the circular wall 16 in order to secure the cover assembly 20 in place.

Figure 7:
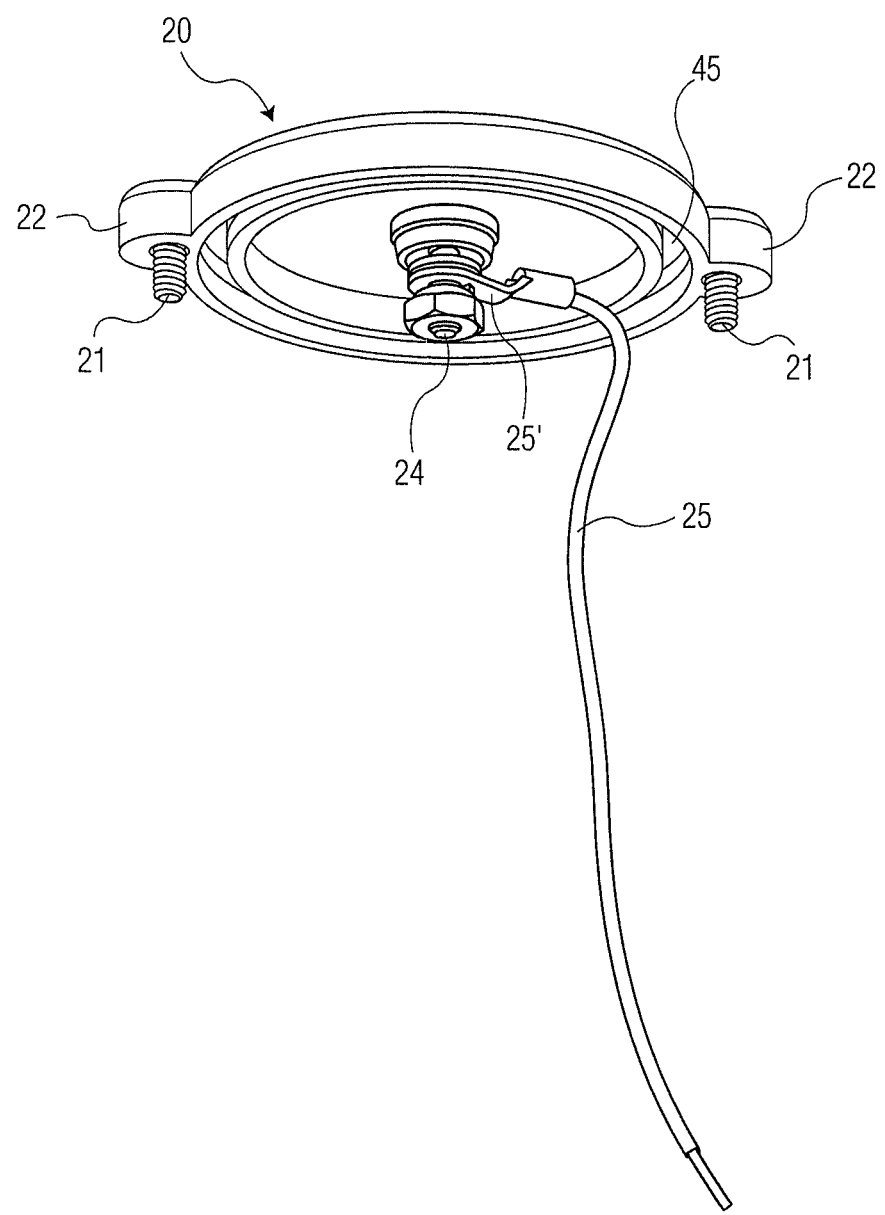
FIG. 7 illustrates an underside view of the junction box cover assembly in accordance with the invention.

Referring to FIG. 7, the junction box cover assembly 20 includes a centrally disposed ground post 24 used to electrically ground the luminaire 10 in the case of a short circuit. As indicated, a ground wire 25 is connected to the post 24 via a ring terminal 25' at one end while the other end is stripped for connection to a mains ground (not shown).

Referring to FIG. 5, the luminaire 10 includes an LED/driver printed circuit board 26 of conventional construction with an array of LEDs 27 for emitting light when electrically activated.

Figure 4:
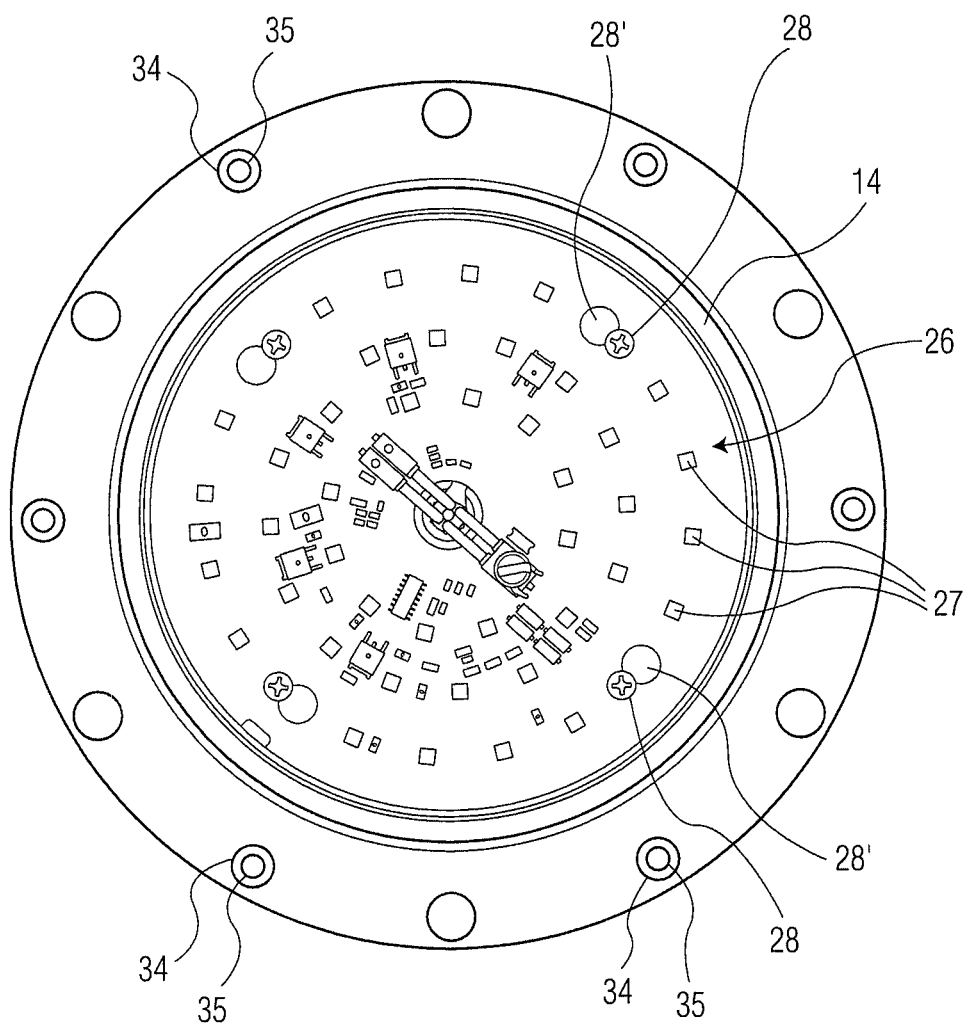
FIG. 4 illustrates a front view of the luminaire of FIG. 1 with the lens cover assembly removed.

Referring to FIGS. 4, 5 and 6, the LED/driver printed circuit board 26 is removably mounted coaxially on the floor 13 of the heat sink assembly 11 for emitting light therefrom. As illustrated, the LED/driver printed circuit board 26 is secured by a plurality of screws 28 directly to the floor 13 such that there is direct contact between the entire back surface of the LED/driver printed circuit board 26 and the surface of the floor 13. In this respect, the screws 28 are threaded into the floor 13 prior to fitting of the printed circuit board 26 into place and the printed circuit board 26 is provided with shaped apertures 28' (see FIG. 4) having a section for passage over the screws and a section for fitting under the heads of the screws 28 upon a slight rotation of the printed circuit board 26 to secure the board 26 in place.

During operation, heat generated by the printed circuit board 26 is transferred to the aluminum heat sink assembly 11 and conducted away from the printed circuit board 26.

Two pairs of wires originate from the LED/driver printed circuit board 26. One pair is for AC powering, and one pair is for dimming the luminaire 10. The PCB Wires 17 (see FIG. 3) are inserted through a hole 13' (FIG. 6) in the floor 13 into the chamber within the wall 16. Any wires from Mains (not shown) and wires from a (0-10 VDC) type commercial dimmer switch (in case one is used) are fed through the ports 19 of the heat sink assembly 11 and are connected to the PCB wires 17 with wire nuts.

A thin layer of thermal transfer compound (not shown) is applied to the LED/driver printed circuit board 26 before securement to the floor 13 of the heat sink assembly 11 in order to be sandwiched between the printed circuit board 26 and the floor 13 to enhance heat transfer from the printed circuit board 26 to the floor 13.

Figure 2:
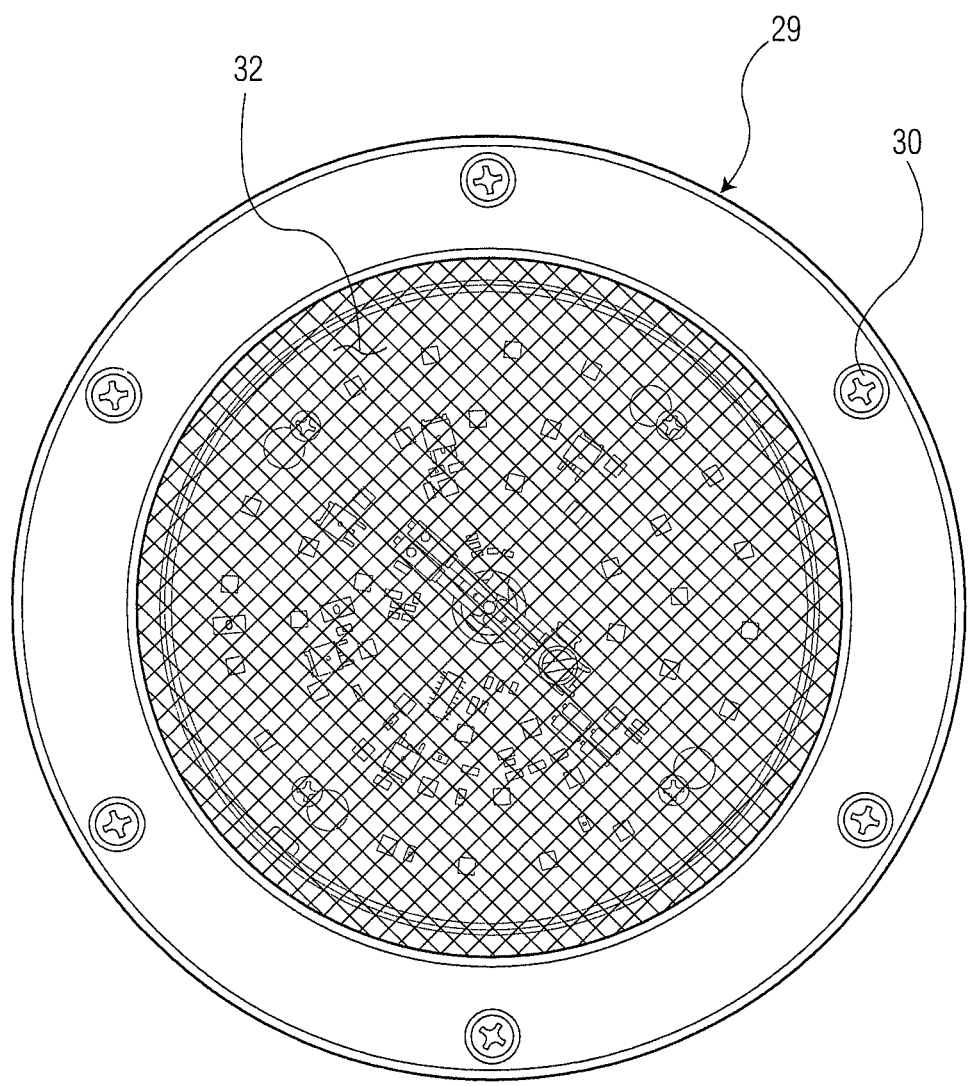
FIG. 2 illustrates a front view of the luminaire of FIG. 1.

Referring to FIGS. 2, 5 and 6, a lens cover assembly 29 is mounted on the flange 12 of the heat sink assembly 11 via a plurality of screws 30. As illustrated, the lens cover assembly 29 includes a circular collar 31 through which the screws 30 pass, a lens 32, for example, of tempered glass or any other suitable material and a circular gasket 33 made of elastomeric material, As indicated, the lens 32 is fitted into the gasket 33 and the gasket 33 seals against the collar 31.

Referring to FIG. 6, the mounting flange 12 of the heat sink assembly 11 has a plurality of apertures 34, each of which has a press-fit insert 35 inserted therein to receive a screw 30 of the lens cover assembly 29 in tight relation.

Figure 8:
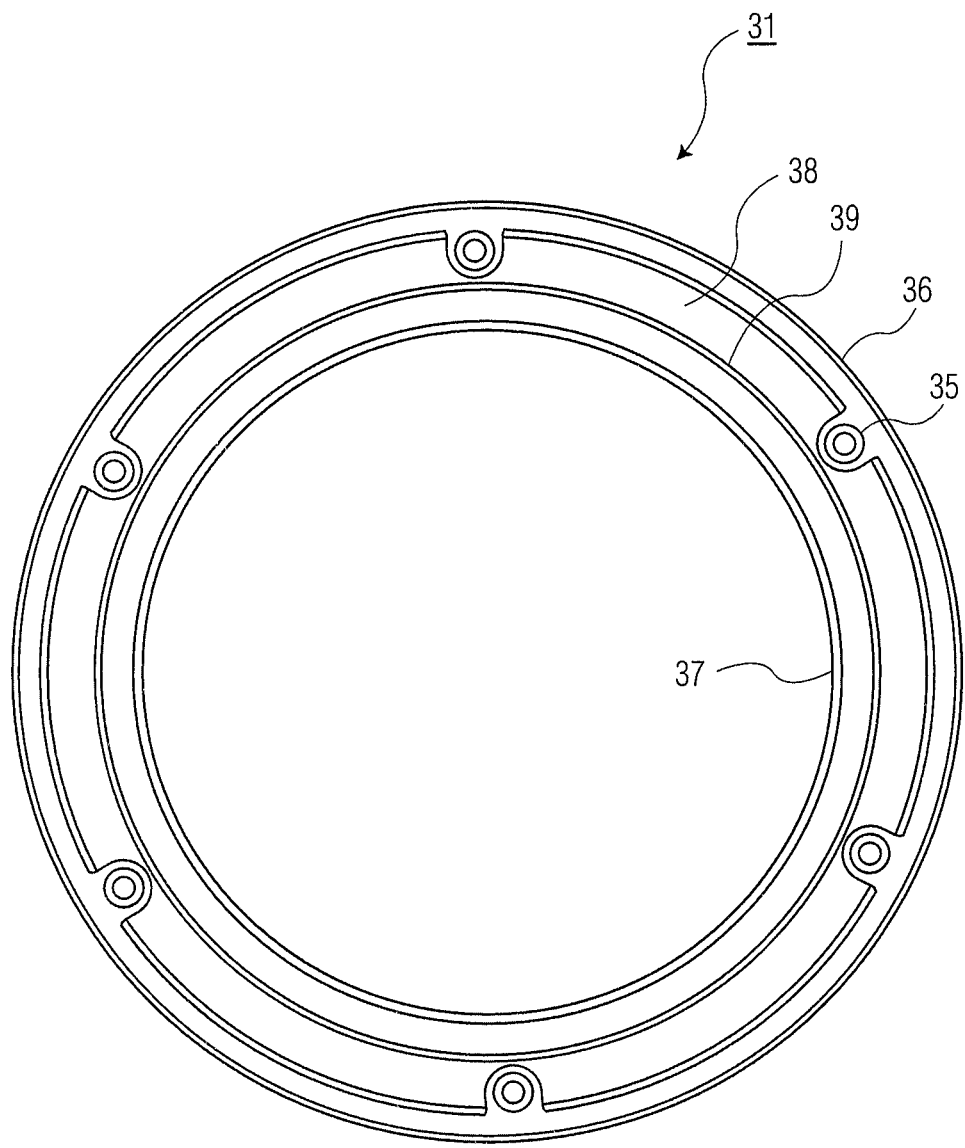
FIG. 8 illustrates an underside view of the collar for mounting the lens in accordance with the invention.
Figure 9:
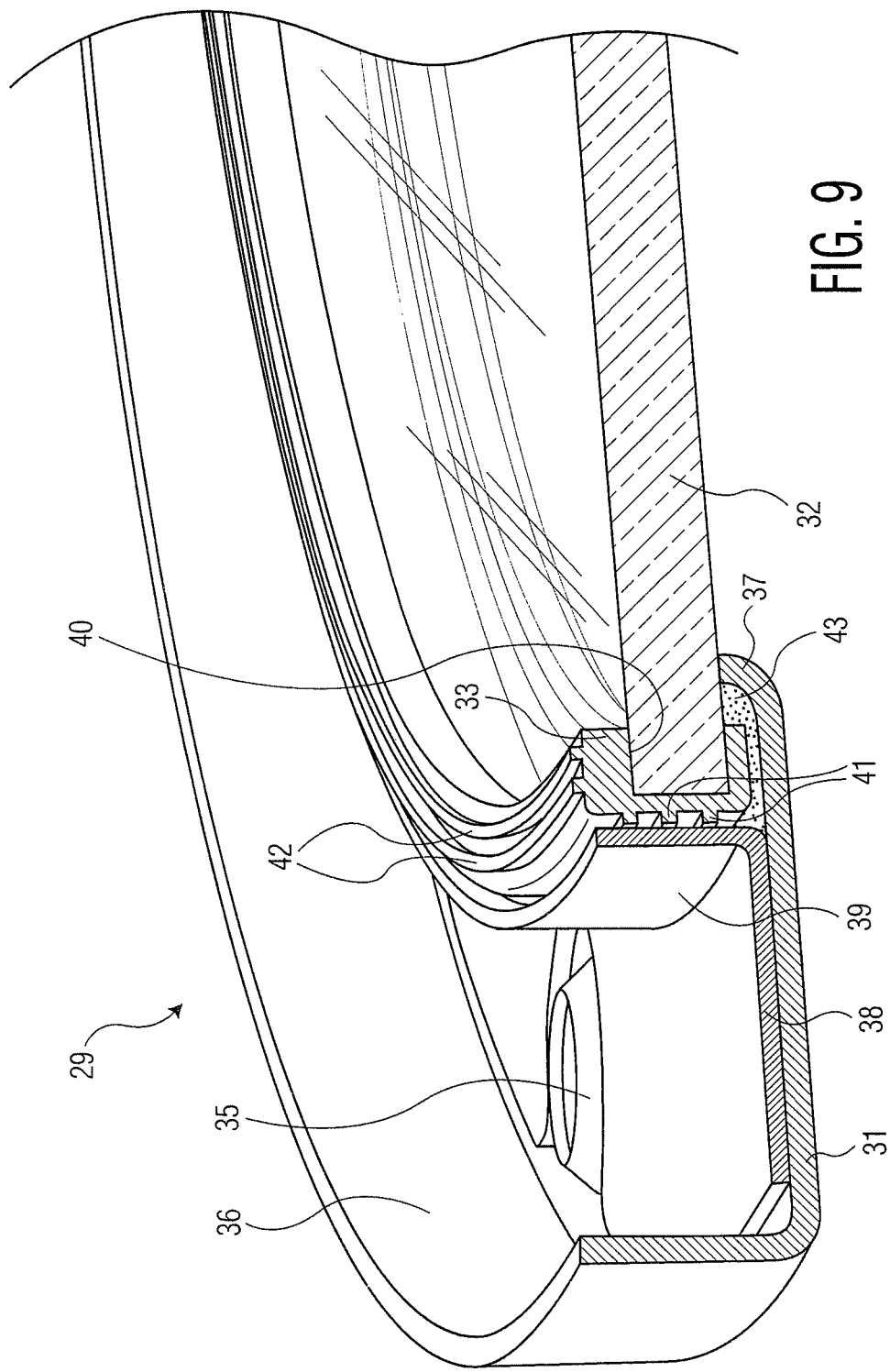
FIG. 9 illustrates a partial cut-away view of a section of the collar with the lens in place.

Referring to FIGS. 8 and 9, wherein like reference characters indicate like parts as above, the collar 31 has an outer rim 36 for fitting circumferentially about the flange 12 of the heat sink assembly 11 and a radially inwardly directed lip 37.

In addition, the lens cover assembly 29 has a circular insert 38 secured concentrically within the collar 31 with an upstanding flange 39 for fitting inside the mounting flange 12 (see FIG. 9). The rim 36 and flange 39 are concentrically spaced apart to form a circular trough to fully contain the mounting flange 12 of the heat sink assembly 11.

As illustrated in FIG. 9, the gasket 33 has a recess 40 on the inside to sealingly receive the perimeter of the lens 32 and has a plurality of sealing ribs 41 on the circumferential periphery sized to fit within and against the flange 39 of the insert 38 in seal tight relation so as to secure to seat against the flange 39. The gasket 33 also has a plurality of sealing ribs 42 on the upper surface, as viewed, to seat against the mounting flange 12 of the heat sink assembly 11.

During assembly, the insert 38 is secured, as by welding, to the collar 31. The lens 32 is separately inserted into the circular gasket 33 and then the gasket 33 and lens 32 are bonded to the collar 31 via six circumferentially spaced apart glue spots 43, e.g. made of silicone adhesive, that fill spaces under the gasket 33 and between the flange 39 and the lip 37. As illustrated, the lip 37 abuts the lens 32 while the glue spots 43 are spaced from the lens 32 so as not to spill over onto the lens 32.

Referring to FIG. 1, a gasket 44 is provided on the flange 12 of the heat sink assembly 11 to create a tight seal between the flange 12 and canopy hood surface (not shown). In addition, a gasket 45 is seated in the junction box cover assembly 20 (FIG. 7).

The gaskets 33, 44, 45 are used to prevent water and other ingress of materials from entering the luminaire during use. Aside from steam rising from a cooking surface, the luminaire 10 will undergo regular pressurized washings on the lens cover side so it is important to keep water out of the luminaire 10 to avoid damaging the electronics inside.

The heat sink assembly 11 and junction box cover assembly 20 are passivated for additional protection against corrosion.

As is known, "passivating" an object means to make the object less chemically reactive to its environment. All metals can corrode over time due to chemical attacks by surrounding oxygen and moisture, and ultimately lead to deterioration and even failure if unchecked. To prevent corrosion, an object is passivated by immersion in an acidic solution to form a thin chemical coating over the entire object. This coating is called the passivated layer and acts as a barrier to prevent the environment from reacting with the metal underneath.

Since the luminaire 10 is to be located in a humid and steamy environment and since the heat sink assembly 11 and the cover of the junction box cover assembly 20 are made of aluminum, these components are passivated for added corrosion protection.

The heat sink assembly 11 is made of die cast aluminum which is very effective in dissipating heat while the collar 31 of the lens cover assembly 29 is made of stainless steel to provide corrosion-resistant properties especially since the assembly 29 will be constantly exposed to steam and water cleanings. In addition, the lens 32 acts as a diffuser to soften the light from the PCB 26 and to focus the beam angle, e. g. to 106°.

The luminaire 10 is otherwise of conventional construction wherein the wiring 17 (FIG. 3) connects the LEDs 27 to a source of electricity via a suitable on/off switch.

The construction of the luminaire 10 is such that the heat generated from a cooking surface onto the luminaire and the heat from operating the LEDS 27 are effectively transferred directly to the heat sink assembly 11.

Further, the construction of the luminaire 10 allows easy access to the LED/driver printed circuit board 26 by simply removing the lens cover assembly 29. Also, the LED/driver printed circuit board 26 may be readily removed from the floor 13 of the heat sink assembly 11 for replacement or servicing should the need arise while keeping the screws 28 secured to the floor 13 of heat sink 11, for example, in the event of a faulty lighting component.

The luminaire 10 is of compact construction and can be readily installed in existing fixtures, such as the canopy hoods employed in commercial kitchens.

The invention thus provides a luminaire that is able to employ LEDs while dissipating the heat imposed on the LEDs in an economical and efficient manner.

What is claimed is:

1. A LED luminaire for a canopy hood comprising
   a heat sink assembly having a circular mounting flange and an internal cavity with a floor that extends across said cavity;
   an LED/driver printed circuit board removably mounted on said floor for emitting light therefrom; and
   a lens cover assembly removably mounted on said flange of said heat sink assembly for passage of light emitted from said printed circuit board.

2. An LED luminaire as set forth in claim 1 wherein said heat sink assembly has a chamber to receive wiring for delivering electricity to said LED/driver printed circuit board and a pair of diametrically disposed ports extending into communication with said chamber for receiving conductors from a mains power supply.

3. An LED luminaire as set forth in claim 2 wherein said heat sink assembly further includes an array of fins extending radially outwardly of said chamber to aid in the dissipation of heat to the surrounding environment.

4. An LED luminaire as set forth in claim 2 further comprising a junction box cover assembly mounted coaxially on said heat sink assembly for sealing said chamber.

5. An LED luminaire as set forth in claim 1 wherein said lens cover assembly includes a circular collar removably secured to said flange and a lens secured in said collar.

6. An LED luminaire as set forth in claim 5 wherein said collar has a radially inwardly directed lip and said lens cover assembly includes a circular insert secured concentrically within said collar and having an upstanding flange fitting inside said flange and a gasket seated in sealing relation in said insert and receiving said lens.

7. An LED luminaire as set forth in claim 6 wherein said gasket has a plurality of sealing ribs on a circumferential periphery thereof sized to fit within and against said flange of said insert in seal tight relation and a plurality of sealing ribs on an upper surface thereof seated against said mounting flange of said heat sink assembly.

8. An LED luminaire as set forth in claim 5 wherein said collar has an outer rim fitting circumferentially about said flange of said heat sink assembly and said lens cover assembly has a circular insert secured concentrically within said collar with an upstanding flange fitting inside said mounting flange to fully contain said mounting flange of said heat sink assembly.

9. An LED luminaire as set forth in claim 5 wherein said collar is made of stainless steel and said heat sink assembly is made of die cast aluminum.

10. An LED luminaire as set forth in claim 1 further comprising a gasket on said flange of said heat sink assembly for sealing against a canopy hood surface.

\* \* \* \* \*